United States Patent [19]
Huang et al.

[11] Patent Number: 6,097,748
[45] Date of Patent: Aug. 1, 2000

[54] VERTICAL CAVITY SURFACE EMITTING LASER SEMICONDUCTOR CHIP WITH INTEGRATED DRIVERS AND PHOTODETECTORS AND METHOD OF FABRICATION

[75] Inventors: Rong-Ting Huang, Gilbert; Chan-Long Shieh, Paradise Valley; Michael S. Lebby, Apache Junction, all of Ariz.

[73] Assignee: Motorola, Inc., Schaumburg, Ill.

[21] Appl. No.: 09/080,152

[22] Filed: May 18, 1998

[51] Int. Cl.$^7$ .................................................. H01S 3/19
[52] U.S. Cl. ................................ 372/50; 372/92; 372/96
[58] Field of Search .................................. 372/31, 50, 96, 372/92, 46, 45; 437/51; 257/84, 80, 82, 750; 357/22, 15, 16; 438/31

[56] References Cited

U.S. PATENT DOCUMENTS

| | | | |
|---|---|---|---|
| 4,745,447 | 5/1988 | Chen | 357/22 |
| 5,323,026 | 6/1994 | Paoli | 257/85 |
| 5,605,856 | 2/1997 | Goosen | 437/51 |
| 5,742,630 | 4/1998 | Jiang | 372/50 |
| 5,745,515 | 4/1998 | Marta | 372/45 |
| 5,751,757 | 5/1998 | Jiang | 372/50 |
| 5,943,357 | 8/1999 | Lebby | 372/50 |
| 5,969,377 | 10/1999 | Seo | 257/72 |
| 5,974,071 | 10/1999 | Jiang | 372/50 |
| 5,978,401 | 11/1999 | Morgan | 372/50 |
| 6,001,664 | 12/1999 | Swirhun | 438/31 |
| 6,005,262 | 12/1999 | Cunningham | 257/84 |
| 6,023,485 | 2/2000 | Claisse | 372/50 |
| 6,034,431 | 3/2000 | Goosen | 257/50 |

*Primary Examiner*—Frank G. Font
*Assistant Examiner*—Gioacchino Inzirillo
*Attorney, Agent, or Firm*—Eugene A. Parsons; William E. Koch

[57] ABSTRACT

A vertical cavity surface emitting laser semiconductor chip including a vertical cavity surface emitting laser (VCSEL) formed on a substrate, a photodetector, integrated with the vertical cavity surface emitting laser for automatic power control (APC) of the vertical cavity surface emitting laser and a driver circuit, integrated with the vertical cavity surface emitting laser and the photodetector. The VCSEL, photodetector and driver circuit are integrated by utilizing a monolithic polysilicon layer. The driver circuit is characterized as a CMOS driver circuit, capable of receiving feedback from the photodetector and adjusting the output power of the vertical cavity surface emitting laser in response to the feedback, thus achieving APC of the VCSEL.

17 Claims, 5 Drawing Sheets

6,097,748

VERTICAL CAVITY SURFACE EMITTING LASER SEMICONDUCTOR CHIP WITH INTEGRATED DRIVERS AND PHOTODETECTORS AND METHOD OF FABRICATION

FIELD OF THE INVENTION

This invention relates, in general, to optical devices and, more particularly, to the integration of light emitting devices, driver circuits and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently used to adjust the power input to the edge emitting device, thereby adjusting the power output.

Recently there has been an increased interest in a new type of laser device called a vertical cavity surface emitting laser (VCSEL). The VCSEL has a potential of several advantages over edge emitting lasers, such as smaller size, higher performance, and more manufacturable.

However, automatic power control of vertical cavity surface emitting lasers (VCSELs) is a difficult task because the VCSEL generally emits light from only a single surface, thus making measurement of the output and subsequent adjustment thereof a difficult task. Conventionally, in order to accomplish this task, several optical devices, such as photodiodes, mirrors, beam splitters, and the like are positioned manually in the optical path of the emission from the VCSEL. With the optical devices being positioned manually, several problems or disadvantages result, such as a high cost of manufacture, a lack of repeatability, and poor quality control, thus prohibiting high volume manufacturing.

In addition, with conventional VCSELs, driver circuitry is provided within a separate semiconductor chip. Thus, it is necessary for the interface of the light emitting device chip to a semiconductor chip that includes driver circuitry for APC. This drive circuitry enables the monitoring of the output power which is subsequently used to adjust the power input to the VCSEL, thereby adjusting the power output It can be readily seen that conventional APC of VCSELs has several disadvantages and problems, thus not enabling their manufacture in volume manufacturing applications. Therefore, an integrated article and method for making same that simplifies the fabrication process, reduces cost, and improves reliability would be highly desirable.

It is a purpose of the present invention to provide a new and improved VCSEL semiconductor chip, including integrated drivers and photodetectors.

It is another purpose of the present invention to provide a new and improved VCSEL semiconductor chip, including integrated drivers and photodetectors, which is simple and relatively inexpensive to manufacture.

It is still another purpose of the present invention to provide a new and improved VCSEL semiconductor chip, including integrated drivers and photodetectors, which are integrated with a minimum of labor and cost.

It is a further purpose of the present invention to provide a new and improved VCSEL semiconductor chip, including integrated drivers and photodetectors, which can be utilized to control the output power of the VCSEL devices.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompany drawings, wherein:

DETAILED DESCRIPTION OF THE DRAWINGS

Figure 1:
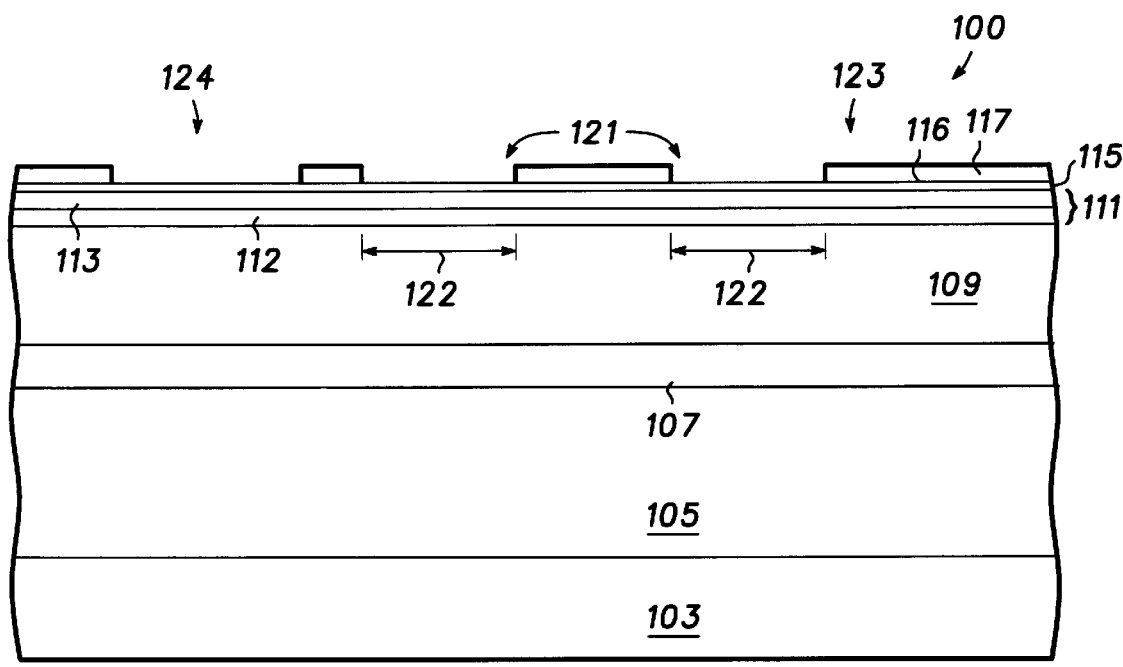
FIG. 1 is a sectional view of a substrate, an active area, a first and a second stack of distributed Bragg reflectors, and a contact region of a partially completed ridge vertical cavity surface emitting laser.

FIG. 1 illustrates a partially fabricated vertical cavity surface emitting layer (VCSEL) 100 including a plurality of epitaxial layers. As shown in FIG. 1, the partially fabricated VCSEL 100 illustrates several elements or features, such as a substrate 103, a first stack of distributed Bragg reflectors 105, an active area 107, a second stack of distributed Bragg reflectors 109, a contact region 111 including layer 112 and a conductive layer 113, a layer 115 having a surface 116, a masking layer 117, and an opening 121 with a size 122. While partially fabricated VCSEL 100 illustrates a single device, it should be understood that many devices can be fabricated on substrate 103. Additionally, it should be further understood that FIGS. 1–9 are sectional views, thus illustrations depicted in FIGS. 1–9, can extend into and out of the drawings.

Generally, substrate 103 is made of any suitable semiconductor material, such as gallium arsenide, silicon, sapphire, or the like. However, in a preferred embodiment of the present invention, substrate 103 is made of gallium arsenide, thereby facilitating subsequent epitaxial growth of additional gallium arsenide and it's derivatives.

The first and the second stacks of distributed Bragg reflectors 105 and 109, active area 107, and layer 112 of contact region 111 are disposed or grown on substrate 103 by any suitable epitaxial method or technique, such as Metal Organic Chemical Vapor Deposition (MOCVD), Molecular Beam Epitaxy (MBE), Chemical Beam Epitaxy (CBE), or the like.

Additionally, the first and the second stacks of distributed Bragg reflectors 105 and 109, as well as active area 107 generally are made layers of aluminum gallium arsenide. These layers of the first and the second stacks of distributed Bragg reflectors 105 and 109 are fabricated so that an aluminum concentration of these layers alternate in concentration. Additionally, the first and the second stack of distributed Bragg reflectors 105 and 109 are alternately doped with either a p-type dopant or an n-type dopant. For example, the first stack of distributed Bragg reflectors 105 can be doped with the n-type dopant, whereas the second stack of distributed Bragg reflectors 109 can be doped with the p-type dopant.

Active area 107 is also made of a variety of layers. Briefly, active area 107 is typically made of a quantum well with barrier regions on either side of the quantum well using any suitable materials. Generally, the barrier regions and the quantum well are made of undoped aluminum gallium arsenide and gallium arsenide each having thicknesses of approximately 100 Angstroms, respectively. Further, it should be understood by one of ordinary skill in the art that additional barrier layers and quantum wells can be added to improve performance of active area 107.

Contact region 111 is made of layer 112 and conductive layer 113. Layer 112 is made of gallium arsenide disposed or grown by any suitable epitaxial method. Typically, layer 112 is grown with a thickness ranging form 100 to 500 Angstroms, having a preferred thickness range from 100 to 300 Angstroms, and a nominal thickness for 100 Angstroms.

Conductive layer 113 is made of any suitable conductive material, such as a metal, e.g., gold (Au), silver (Ag) copper (Cu), aluminum (Al), tungsten (W), an alloy, e.g., aluminum/copper (Al/Cu), titanium tungsten (TiW), or the like. Deposition of conductive layer 113 on layer 112 is achieved by any suitable method or technique, such sputtering, evaporation, and the like. Additionally, it should be understood that while specific thickness of conductive layer 113 changes with specific applications and designs. Thickness of conductive layer 113 can range from 2,000 to 10,000 Angstroms, with a preferred range form 3,000 to 8,000 Angstroms, and having a nominal thickness of 4,000 Angstroms.

Layer 115 is made of any suitable dielectric material, such as silicon dioxide ($SiO_2$), silicon nitride ($Si_3N_4$), or the like. Additionally, any suitable method or technique, such as Chemical Vapor Deposition (CVD), e.g., Low Pressure Chemical Vapor Deposition (LPCVD), Plasma Enhanced Chemical Vapor Deposition (PECVD), or the like is used for disposing or depositing layer 115 on conductive layer 113. While specific thicknesses of layer 115 change with specific applications and designs, thickness of layer 115 can range from 3,000 to 8,000 Angstroms, with a nominal thickness of 4,000 Angstroms.

As shown in FIG. 1., masking layer 117 is patterned to make openings 121 and 124 that expose portions of surface 116. Masking layer 117 is made of any suitable lithographic process, such as photolithography, X-ray lithography, or the like. Generally, lithographic processes are well known in the art; however, by way of example, a brief explanation of a positive photolithographic process is provide hereinbelow.

Briefly, a photolithographic material, such as photoresist, or the like is applied to surface 116 of layer 115. The photolithographic material is exposed with a pattern of light and developed, thereby providing open areas, illustrated by openings 121 having size 122 being on the order of 15 microns, and opening 124, as well as covered areas, illustrated by masked areas 123. The pattern that is used to expose the photolithographic material can form any number of geometric patterns and designs, such as rings, ovals, lines, squares, or the like. In the present case a ring is formed in masking layer 117, thereby making openings 121 and 124 and exposing a portion of surface 116 of layer 115.

After exposing and developing processes of masking layer 117, substrate 103 is ready to be etched. Substrate 103 is etched in any suitable etch system that provides an anisotropic etch profile. Further, any suitable etch chemistry is used for etching substrate 103, such as a fluorine based chemistry, a chlorine based chemistry, or the like. Generally, fluorine based chemistry is used to etch or remove a variety of materials, such as nitride, silicon dioxide, tungsten, titanium tungsten, and the like; whereas the chlorine based chemistry also is used to remove a variety of material, such as semiconductor materials, e.g., silicon, gallium arsenide, aluminum gallium arsenide, as well as conductive materials, such as aluminum, e.g., copper, aluminum, and the like. Additionally, it should be understood that these chemistries can be used in the same etching system, thereby enabling a multitude of layers or different materials to be etched in one etching system. Thus, the process of manufacturing a vertical cavity surface emitting laser is more manufacturable.

More specifically, with layer 115 being silicon nitride, with conductive layer 113 being titanium tungsten, layer 112 and with the stacks of distributed Bragg reflectors 109 being gallium arsenide based with appropriate layers, layer 115 and conductive layer 113 are etched in the fluorine based chemistry using gas sources, such as triflouromethane ($CHF_3$), tetrafluoromethane ($CF_4$), or the like, and layer 112 and the first stack of distributed Bragg reflectors 109 are etched in the chlorine based chemistry using gas sources, such as Boron triChloride ($BCl_3$), Silicon tetraChloride ($SiCl_4$), and the like. Process parameter values for the gaseous plasma include pressure, power, and DC Bias. Generally, pressure can range from 5 millitorrs to 200 millitorrs, with a preferred range from 10 to 100 millitorrs, and a nominal value of 20 millitorrs. Power, as measured by Radio Frequency Watts, can range from 20 to 1,500 Watts, with a preferred range from 50 to 1,200 Watts, and a nominal value of 90 Watts. DC Bias, as measured by Voltage Direct Current (VDC), can range from 200 to 1,000 VDC, with a preferred range from 300 to 700 VDC, and a nominal value 500 VDC. It should be understood by one of ordinary skill in the art that the values presented hereinabove are approximate and are dependent upon specific pieces of equipment.

Figure 2:
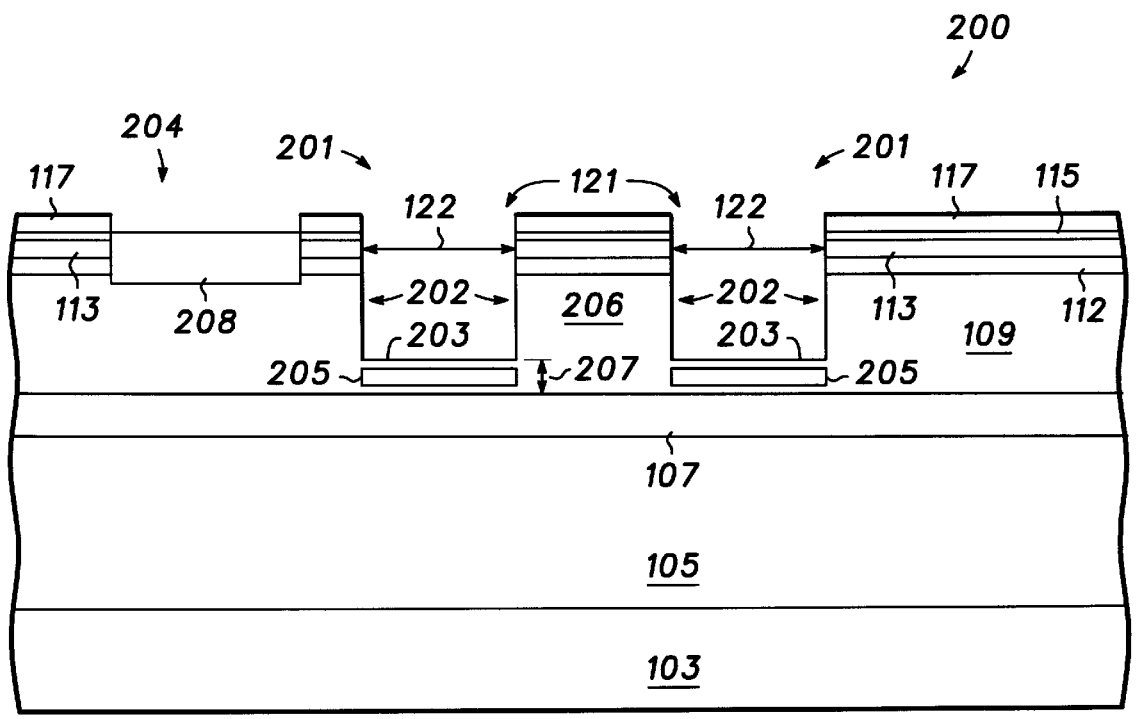
FIG. 2 is a sectional view of the substrate, as shown in FIG. 1, after an etch process to the partially completed ridge vertical cavity surface emitting laser.

FIG. 2 is a sectional view of substrate 103, as shown in FIG. 1, after etching to generate trenches 201 and 204 in partially completed vertical cavity surface emitting laser 200. It should be understood that elements and figures previously identified in FIG. 1 will retain their original identifying numerals. As shown in FIG. 2, the partially fabricated VCSEL 100 is further illustrated with trench 201 having sidewalls 202 and a bottom 203, a ridge structure or ridge 206, a plurality of regions 205 and 208, and a distance 207. It should be understood that regions 205 serve to electrically isolate VCSEL 100 and region 208 serves to electrically isolate the integrated driver circuit (discussed presently) from VCSEL 200.

With substrate 103 being etched anisotropically, sidewalls 202 typically have a vertical orientation in which little lateral dimensionality of opening 121 is lost. That is, size 122 of opening 121 of masking layer 117 is transferred to a material that is under masking layer 117. For example, size 122 of opening 121 is transferred through layer 115, conductive layer 113, layer 112, and into a portion of second stack of distributed Bragg reflectors 109.

Etching of substrate 103 continues until distance 207 from bottom 203 to active area 107 is achieved. Distance 207 is measured as a distance from active area 107 to bottom 203. Typically, distance 207 can range from 1 microns or less, and a preferred distance of 0.75 microns or less, with a nominal distance of 0.5 micron or less. Accurate determination of distance 207 is achieved by any suitable detection method, such as time, an optical end point, gaseous emission end point, or the like. Etching of substrate 103 generates ridge 206 that is partially isolated from a remainder of bulk material of the second stack of distributed Bragg reflectors 109.

Once the etch is completed, regions 205 and 208 are formed in the second stack of distributed reflectors 109, thereby further isolating ridge 206 and the integrated driver circuit (discussed presently). Regions 205 and 208 locally disrupt conductivity of the second stack of distributed reflectors 109. In particular, regions 205 serves to confine a current to ridge structure 206. Generally, regions 205 and 208 are made by implanting ions in bottom 203 of trench 201 and in trench 204. Implantation of atoms is achieved by implanting any suitable ion, such as boron, oxygen, or hydrogen. However in a preferred embodiment of the present invention, hydrogen atoms are used. Typically, the hydrogen atoms are implanted with an energy and dose that range from 40 to 60 keV, with a preferred range from 45 to 55 keV, and nominal value of 50 keV, and 2E12 to 2E16/cm2, with preferred range from 2E13 to 2E15, with a nominal value of 2E14, respectively. It should be understood that both the etch and the implantation of ions should be kept above active area 107 so as to achieve good reliability. Additionally, it should be further understood that masking layer 117 of substrate 103 can be cleaned at various stages of processing, such as after the etch processes and after the ion implantation process.

Figure 3:
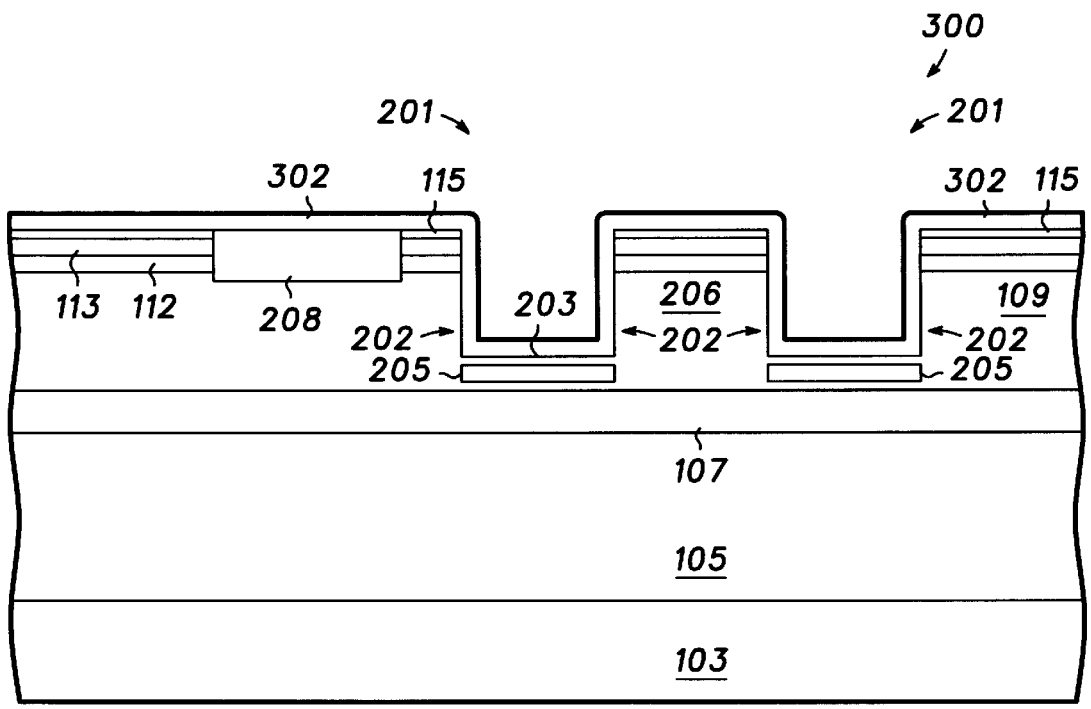
FIG. 3 is a sectional view of the substrate, as shown in FIG. 2, after deposition of a layer to the partially completed ridge vertical cavity surface emitting laser.

FIG. 3 is a sectional view of substrate 103, as shown in FIG. 2, after deposition of a layer 302 on partially completed vertical cavity surface emitting laser 300. It should be understood that elements and figures previously identified in FIGS. 1 and 2 will retain their original identifying numerals. As shown in FIG. 3, the partially fabricated VCSEL 300 is further illustrated with a layer 302.

Generally, layer 302 has been deposited or disposed on partially fabricated VCSEL 300, thus covering sidewalls 202 and bottom 203, as well as layer 115. Additionally, it should be noted that the deposition of layer 302 is achieved conformally, thus applying roughly equal amounts of layer 302 all surfaces. Further, layer 302 is similar to layer 115 as described hereinabove, thus layer 302 is not describe in detail at present. In addition, layer 302 is applied and processed in a similar fashion as layer 115 as described hereinabove, thus the processing of this layer is not described in detail.

Figure 4:
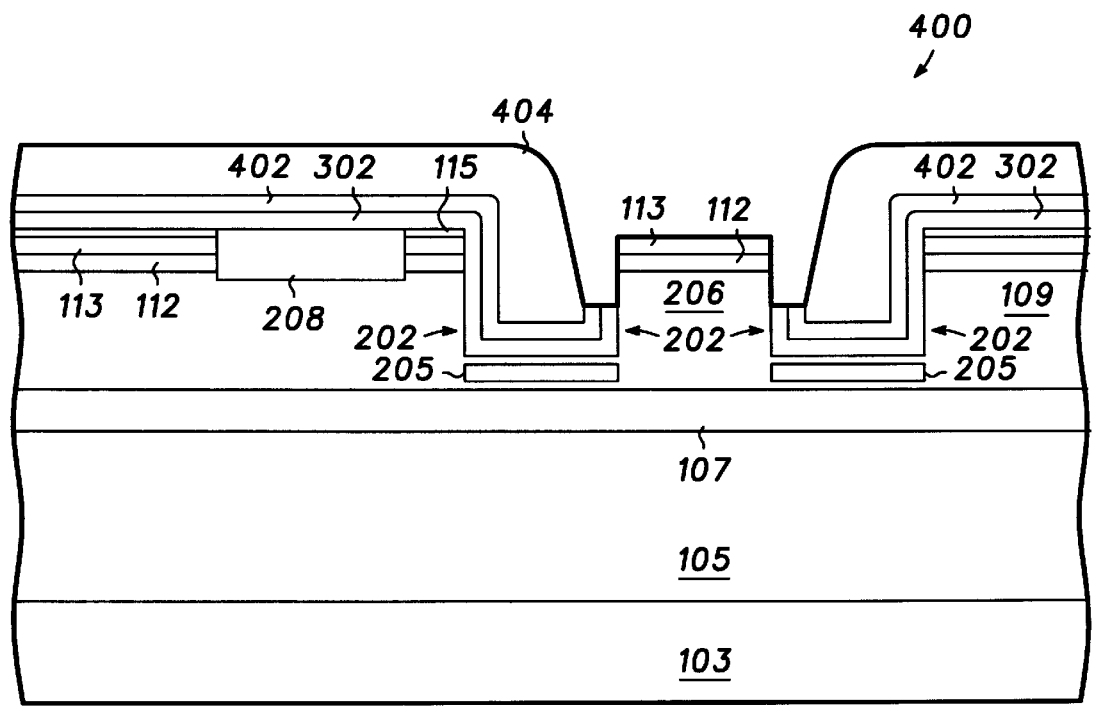
FIG. 4 is a is a sectional view of the substrate, as shown in FIG. 3, after another etching process to the partially completed ridge vertical cavity surface emitting laser.

FIG. 4 illustrates a layer 402 and a masking layer 404 deposited or disposed on partially fabricated vertical cavity surface laser 400. Masking layer 404 is exposed and developed, and subsequently etched to expose conductive layer 113 of ridge 206. It should be understood that elements and figures previously identified in FIGS. 1–3 will retain their original identifying numerals.

Generally, layer 402 is deposited in a similar fashion as layer 115 as described hereinabove. Briefly, layer 402 is deposited on substrate 103, thereby covering layer 302 with layer 402. Masking layer 404 is subsequently applied, exposed and developed to expose ridge 206 with layers 115, 302 and 402 thereon.

Substrate 103 is then etched in a fluorine based chemistry as previously described to remove the exposed layers 115, 302 and 402, thereby exposing conductive layer 113 of ridge 206. Additionally, it should be noted that masking layer 404 protects other areas of the partially completed vertical cavity surface emitting laser 400. Substrate 103 is subsequently cleaned to remove debris, as well as remaining masking layer 404.

Figure 5:
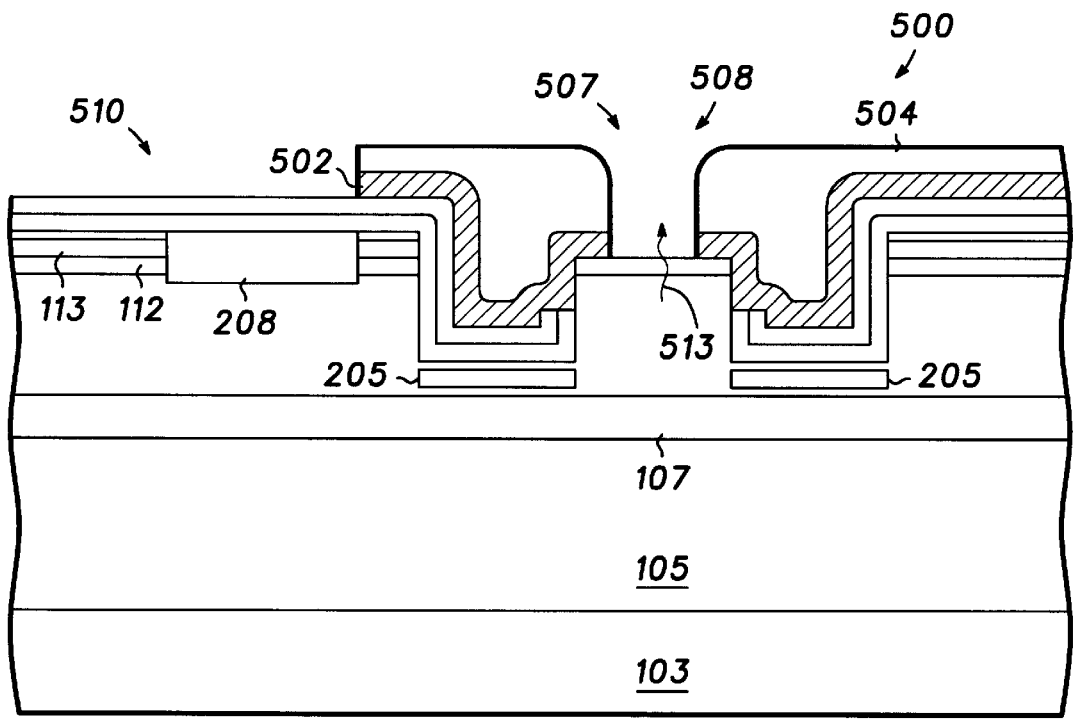
FIG. 5 is a sectional view of the substrate, as shown in FIG. 4, after removal of a layer of the partially completed ridge vertical cavity surface emitting laser.

FIG. 5 is a sectional view of substrate 103, as shown in FIG. 4, after deposition of a conductive layer 502 and application, exposure, development of masking layer 504 with a subsequent etch of substrate 103. It should be understood that elements and figures previously identified in FIGS. 1–4 will retain their original identifying numerals. As shown in FIG. 5, the partially fabricated vertical cavity surface emitting laser 500 is further illustrated with a conductive layer 502, a masking layer 504, opening 507, opening 510, and light 513.

Conductive layer 502 is made of any suitable conductive material, such as a metal, e.g., aluminum, copper, tungsten, titanium, or the like, an alloy, e.g., aluminum/copper, titanium tungsten, or the like, or a combination of metal or alloy layer or layers, e.g., aluminum, gold, titanium/tungsten, or the like. In a preferred embodiment of the present invention, conductive layer 502 is made of a combination of layers. More specifically, a layer of titanium/tungsten is disposed or deposited on substrate 103 as previously described with reference to conductive layer 113.

Briefly, the titanium/tungsten (titungsten) layer is deposited having a thickness ranging from 2,000 to 6,000 Angstroms, with a preferred range from 3,000 to 5,000 Angstroms, and a nominal thickness value of 4,000 Angstroms. Additionally, another layer of either gold or aluminum is deposited on the titanium/tungsten layer. Typically, the gold or the aluminum layer is deposited having a thickness ranging from 500 to 1,500 Angstroms, with a preferred range from 700 to 1,300 Angstroms, and a nominal thickness value of 1,000 Angstroms.

Masking layer 504 is subsequently applied to conductive layer 502, exposed and developed to expose openings 507 and 510. Substrate 103 including openings 507 and 510 is etched by any suitable method or technique, such as the gaseous plasma as described herein above, or a wet chemical etch. With conductive layer 502 being made of the titanium/tungsten layer with a layer of either gold or aluminum, conductive layer 502 is etched with a combination of etching techniques depending upon specific material compositions. Regarding the etching of the gold or aluminum layer, if gold is used a potassium iodide etchant is used; however, if aluminum is used a potassium hydroxide is used. Regarding the etching of the titanium/tungsten, a dry etch having a fluorine based chemistry is used. By etching or removing conductive layer 502 through an opening 508 of masking layer 504, window or opening 507 is fabricated, thereby allowing light 513 to exit ridge 206 when properly excited. In addition, opening 510 is fabricated, thereby allowing for the fabrication of the integrated driver circuits (discussed presently).

Further, it should be understood that substrate 103 is cleaned so as to remove all residue material, as well as masking layer 504, thereby making substrate 103 ready for a next application. After completion of the etch, substrate is cleaned to remove debris and remaining masking layer 504.

Figure 6:
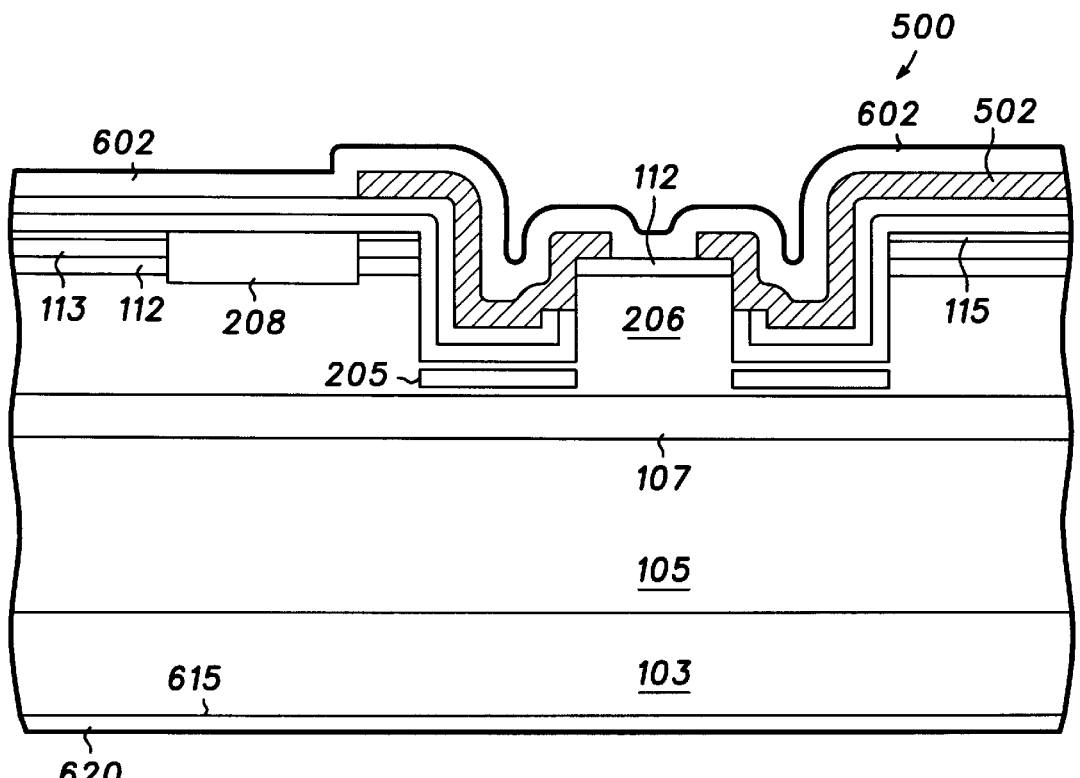
FIG. 6 is an example of a ridge vertical cavity surface emitting laser.

FIG. 6 is a sectional view of substrate 103, as shown in FIG. 5, after an antireflective coating layer 602 is applied and processed. It should be understood that similar elements and features previously identified in FIGS. 1–5 will retain their original identifying numerals.

Antireflective coating layer 602 is any suitable material, such as a nitride material, an organic material, or the like. In a preferred embodiment of the present invention, a nitride layer is disposed or deposited on substrate 103, thereby forming antireflective coating layer 602. Generally, with antireflective coating layer 602 being a nitride layer, antireflective coating layer 602 is similar to layer 115 as described hereinabove, thus nitride layer processing is not further described at present. The nitride layer is deposited on substrate 103 covering conductive layer 502 and layer 112 of ridge 206.

Next, a surface 615 of substrate 103 is made into a contact 620. Typically, a combination of layers, e.g., nickel/germanium/gold are deposited on surface 615 of substrate 103. Substrate 103 and the combination of layers are then annealed to combine the combination of layers into the substrate 103. Any suitable annealing process can be used. However, in a preferred embodiment of the present invention, a Rapid Thermal Anneal (RTA) at 450 degrees Celsius is used. Contact 620 will serve as a cathode for VCSEL 600.

Figure 7:
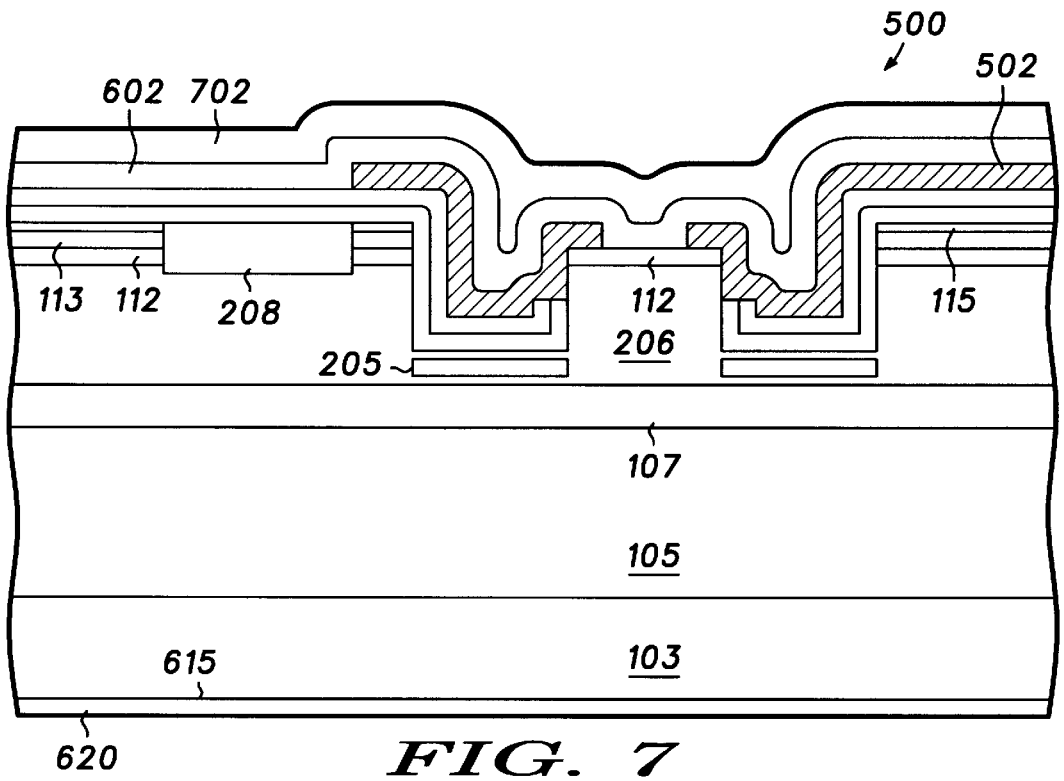
FIG. 7 is a sectional view of the substrate, as shown in FIG. 6, after deposition of a layer of polysilicon.

Referring now to FIG. 7, illustrated is a sectional view of substrate 103, as shown in FIG. 5, after a polysilicon layer 702 is applied and processed. It should be understood that similar elements and features previously identified in FIGS. 1–6 will retain their original identifying numerals. Once the wafer structure of VCSEL 500 is fabricated, a layer of polysilicon 702 is deposited over antireflective coating layer 602. Layer 702 of polysilicon is deposited on the top of the VCSEL wafer and is utilized to fabricate the driver circuits (discussed presently) and photodetectors (discussed presently).

Typically, polysilicon layer 702 is deposited on antireflective coating layer 602, thereby covering layer 602 with layer 702. It should be noted that the deposition of layer 702 is achieved conformally, thus applying roughly equal amounts of layer 702 across the VCSEL structure. Briefly, polysilicon layer 702 is deposited having a thickness ranging from 500 to 5000 Angstroms, with a preferred range from 500 to 2000 Angstroms, and a nominal thickness value of 1000 Angstroms.

Figure 8:
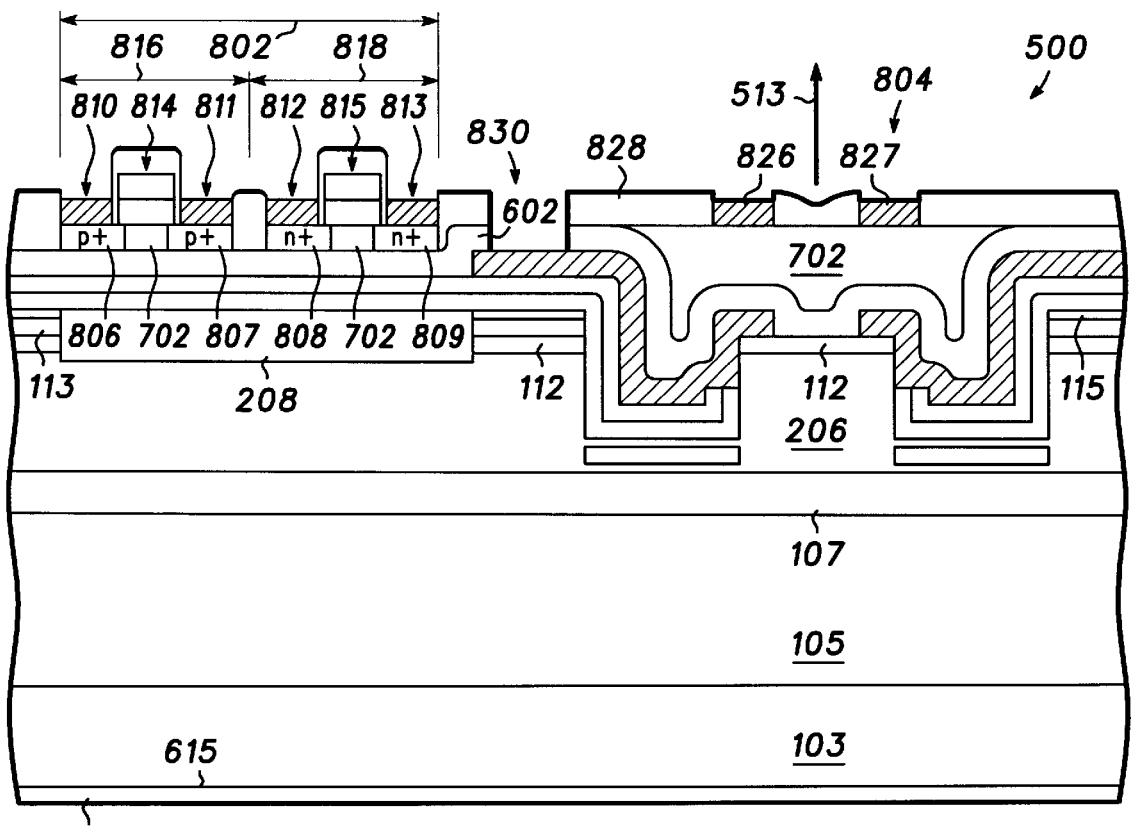
FIG. 8 is a sectional view of the substrate, as shown in FIG. 7, after another etching process to the partially completed ridge vertical cavity surface emitting laser, illustrating fabrication of the integrated driver circuit and vertically integrated p-i-n photodiode.
Figure 9:
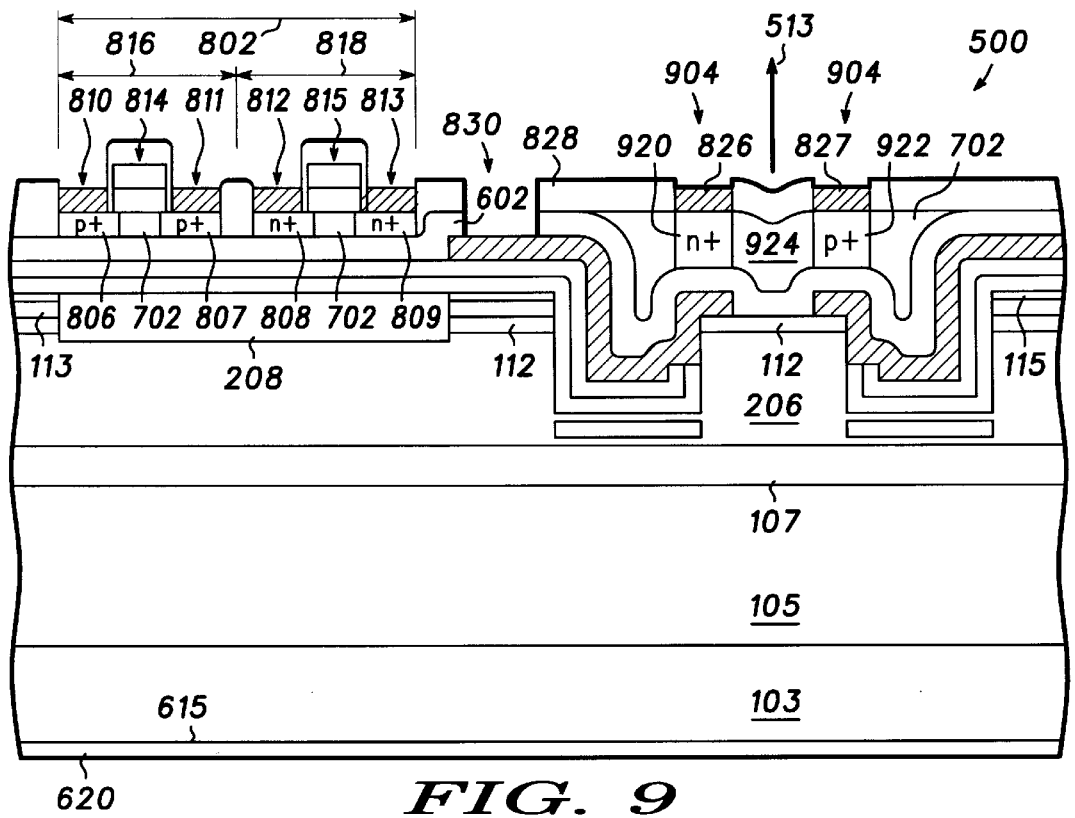
FIG. 9 is, a sectional view of the substrate, as shown in FIG. 7, after another etching process to the partially completed ridge vertical cavity surface emitting laser, illustrating fabrication of the integrated driver circuit and laterally integrated p-i-n photodiode.

Referring now to FIGS. 8 and 9, illustrated in FIG. 8 is a sectional view of substrate 103, as shown in FIG. 7, after another series of etching steps to the partially completed ridge vertical cavity surface emitting laser 500, illustrating fabrication of the integrated driver circuit 802 and vertically integrated p-i-n photodiode 804. In an alternative embodiment and as shown in FIG. 9, illustrated is a similar sectional view of substrate 103, including the integrated circuit 802 and an integrated lateral p-i-n photodiode 904.

Integrated driver circuit 802 in this preferred embodiment is described as a polysilicon CMOS driver circuit well known in the art. Utilizing a plurality of masking and etching steps, driver circuit 802 is fabricated by initially forming within polysilicon layer 702, source and drain regions. More particularly, formed in polysilicon layer 702 are p-MOS drain region 806, p-MOS source region 807, n-MOS drain region 808 and n-MOS source region 809. It should be understood, as illustrated, regions 806, 807, 808 and 809 have formed on a surface contacts 810, 811, 812 and 813, respectively. Contacts 810, 811, 812 and 813 are typically formed of a conductive material, such as aluminum, titanium tungsten, polysilicon, or the like. Next, n-MOS and p-MOS gate structures are formed. Illustrated are gate structures 814 and 815, respectively. It should be understood that gate structures 814 and 815 includes a gate oxide material, generally any type of suitable insulative material, such as silicon oxide ($SiO_2$) and a conductive material disposed on a surface of the insulative material, such as polysilicon, or aluminum. In combination, this insulative material and conductive material form gate structures 814 and 815. As illustrated, through the process of forming these structures using masking and etching techniques, a complete CMOS driver circuit 802 is fabricated including a p-MOS structure 816 and n-MOS structure 818.

Referring specifically to FIG. 8, in this preferred embodiment photodetector 804 is described as a p-i-n photodiode, and is sometimes referred to herein as p-i-n photodiode 804. P-i-n photodiode 804 in a preferred embodiment is vertically integrated relative to VCSEL 500. More particularly, p-i-n photodiode 804 is fabricated by doping polysilicon layer 702 with a p-dopant and an n-dopant. It should be understood that any suitable p-type doping or n-type doping, such as phosphorus and boron, respectively, can be used in doping of polysilicon layer 702. Doping of polysilicon layer 702 is achieved through implant or diffusion techniques well known in the doping art. In an alternative embodiment, a n-i-n photoconductor is formed by doping polysilicon layer 702 with a n-dopant, thereby having two n-doped regions separated by an intrinsic region, and forming a n-i-n structure.

In yet another alternative embodiment, and as illustrated in FIG. 9, a p-i-n photodiode 904 is fabricated by doping a region 920 of polysilicon layer 702 with a n-dopant and doping a region 922 of polysilicon layer 702 with a p-dopant. A region 924 of polysilicon layer 702 remains undoped and is characterized as an intrinsic region. In an alternative embodiment, a n-i-n photoconductor is formed by doping region 922 with a n-dopant, thereby having two n-doped regions separated by an intrinsic region, and forming a n-i-n structure.

Referring again to FIGS. 8 and 9, a plurality of contacts 826 and 827 are disposed on an uppermost surface of the doped regions and serve as an anode and cathode contact for photodetector 804/904.

Once driver circuit 802 and photodiode 804/904 are formed into polysilicon layer 702, a passivation layer 828 is disposed over the entire structure. Passivation layer 828 is generally composed of a field oxide material, and protects the device and circuitry from moisture. Passivation layer 828 is patterned using masking and etching technology to expose drain and source contacts 810, 811, 812 and 813, a contact 830 which will serve as an anode for VCSEL 500 operating in combination with contact 620 (previously discussed) which serves as the cathode for VCSEL 600, and contacts 826 and 827 which serve as a cathode and anode, respectively, for photodetector 804/904.

Figure 10:
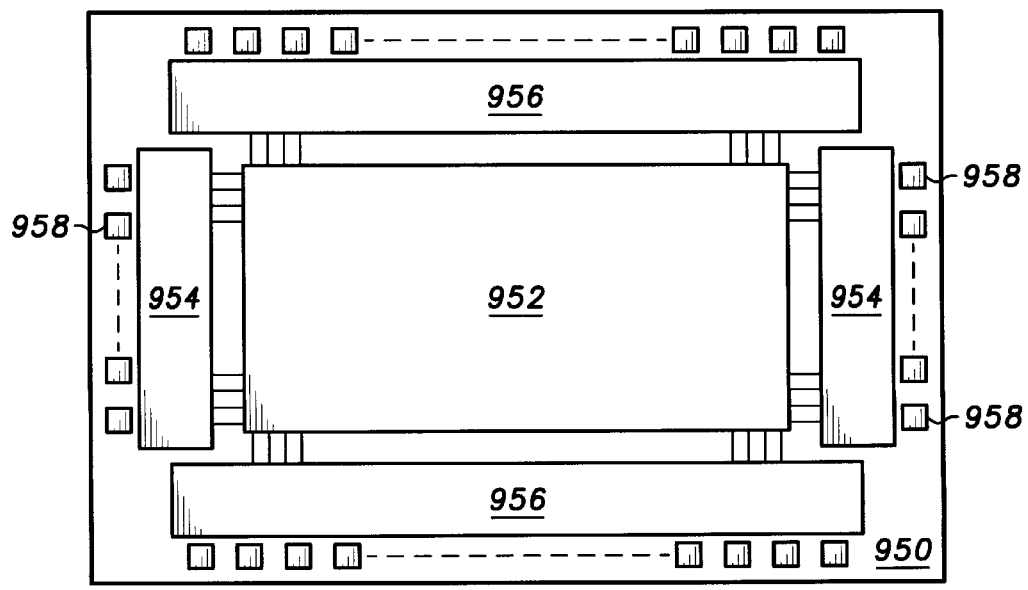
FIG. 10 is a top view of a semiconductor chip including the integrated VCSEL, detectors and drivers according to the present invention.

Referring now to FIG. 10, illustrated in top view is a semiconductor chip 950 including a VCSEL array 952. VCSEL array 952 is generally composed of a plurality of VCSEL structures fabricated according to the method disclosed herein with regard to VCSEL 500 and a plurality of photodetectors fabricated according to the method disclosed herein with regard to photodetector 804 of FIG. 8 or photodetector 904 of FIG. 9. It should be understood that VCSEL array 952 is fabricated and thus described as either a passive array or an active array. In the instance where VCSEL array 952 includes an active matrix array, each pixel would include a polysilicon thin film transistor as an active matrix switch and a surface emitting laser. Semiconductor chip 950 includes a plurality of integrated driver circuits, including row driver circuits 954 and column driver circuits 956. Row and column driver circuits 954 and 956 are disclosed as fabricated according to the method disclosed herein with regard to driver circuit 802 of FIGS. 8 and 9. Driver circuits 954 and 956 are fabricated about a periphery of semiconductor chip 950 thereby providing for ease in interfacing of semiconductor chip 950 to a power source, a printed circuit board (PCB), or the like. To provide for interconnect of semiconductor 950 there are provided a plurality of contact pads 958 positioned about a perimeter of semiconductor chip 950. Contact pads 958 are interfaced using metal interconnects, such as patterned aluminum traces, so as to electrically interface contact pads 958 with driver circuits 954 and 956 and VCSEL array 952.

During operation, the optical output power of each individual VCSEL in array 952 is measured by the integrated photodetectors. This measurement is subsequently used to adjust the electrical power input to the individual VCSEL devices and thereby, adjust the optical output power. Adjustment of the power is achieved by establishing a feedback loop between each individual photodetector of array 952 and driver circuits 954 or 956 to adjust the laser injection current to maintain a constant laser emission power in response to the feedback.

By now it should be appreciated that a novel VCSEL semiconductor chip with integrated drivers and photodetectors and a method for fabricating the VCSEL semiconductor chip with integrated drivers and photodetectors has been provided. This device and method for making the integrated VCSEL chip provides for a highly integrated device that has manufactured as a part thereof drivers and photodetectors for automatic power control (APC) of the VCSEL devices. The VCSEL semiconductor chip with integrated drivers and photodetectors made with this method can be utilized in a wide variety of applications.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser semiconductor chip comprising:
   a vertical cavity surface emitting laser formed on a substrate;
   a photodetector, integrated with the vertical cavity surface emitting laser for automatic power control of the vertical cavity surface emitting laser; and
   a laterally integrated driver circuit, formed on the substrate, and about a periphery of the substrate, the driver circuit characterized as receiving feedback from the photodetector and adjusting an output power of the vertical cavity surface emitting laser in response to the feedback.

2. A vertical cavity surface emitting laser semiconductor chip as claimed in claim 1 wherein the vertical cavity surface emitting laser is a passive array of vertical cavity surface emitting lasers.

3. A vertical cavity surface emitting laser semiconductor chip as claimed in claim 1 wherein the vertical cavity surface emitting laser is an active-matrix array of vertical cavity surface emitting laser.

4. A vertical cavity surface emitting laser semiconductor chip as claimed in claim 1 wherein the photodetector is a laterally integrated p-i-n-photodiode.

5. A vertical cavity surface emitting laser semiconductor chip as claimed in claim 1 wherein the photodetector is a laterally integrated n-i-n-photodiode.

6. A vertical cavity surface emitting laser semiconductor chip as claimed in claim 1 wherein the photodetector is a vertically integrated p-i-n-photodiode.

7. A vertical cavity surface emitting laser semiconductor chip as claimed in claim 1 wherein the photodetector is a vertically integrated n-i-n-photodiode.

8. A vertical cavity surface emitting laser semiconductor chip as claimed in claim 1 wherein the driver circuit is an integrated polysilicon CMOS driver circuit.

9. A vertical cavity surface emitting laser semiconductor chip as claimed in claim 3 wherein the pixel of the active-matrix array includes a polysilicon thin film transistor as an active-matrix switch and a surface emitting laser.

10. A vertical cavity surface emitting laser semiconductor chip comprising:
    a vertical cavity surface emitting laser formed on a substrate;
    an integrated photodetector formed on the substrate, adjacent the vertical cavity surface emitting laser; and
    a laterally integrated polysilicon CMOS driver circuit formed on the substrate, adjacent the integrated photodetector, and about a periphery of the substrate.

11. A vertical cavity surface emitting laser semiconductor chip as claimed in claim 10 wherein the vertical cavity surface emitting laser is characterized as a wafer structure and includes a first stack of distributed Bragg reflectors disposed on a surface of the substrate, an active region disposed on the first stack of distributed Bragg reflectors, a second stack of distributed Bragg reflectors disposed on the active region, a contact region and a dielectric layer.

12. A vertical cavity surface emitting laser semiconductor chip as claimed in claim 11 further including a polysilicon layer disposed on an upper surface of the vertical cavity surface emitting laser wafer structure.

13. A vertical cavity surface emitting laser semiconductor chip as claimed in claim 12 wherein the integrated photodetector and the laterally integrated CMOS driver circuit are formed in the polysilicon layer.

14. A vertical cavity surface emitting laser semiconductor chip as claimed in claim 12 wherein the integrated photodetector includes a laterally integrated p-i-n photodiode fabricated about a periphery of the vertical cavity surface emitting laser.

15. A vertical cavity surface emitting laser semiconductor chip as claimed in claim 12 wherein the integrated photodetector includes a laterally integrated n-i-n photoconductor fabricated about a periphery of the vertical cavity surface emitting laser.

16. A vertical cavity surface emitting laser semiconductor chip as claimed in claim 12 wherein the integrated photodetector includes a vertically integrated p-i-n photodiode fabricated on an uppermost surface of the vertical cavity surface emitting laser and within the polysilicon layer.

17. A vertical cavity surface emitting laser semiconductor chip as claimed in claim 12 wherein the integrated photodetector includes a vertically integrated n-i-n photoconductor fabricated on an uppermost surface of the vertical cavity surface emitting laser structure and within the polysilicon layer.

* * * * *